(12) United States Patent
Lim et al.

(10) Patent No.: US 8,836,019 B2
(45) Date of Patent: Sep. 16, 2014

(54) RECESSED CHANNEL TRANSISTORS, AND SEMICONDUCTOR DEVICES INCLUDING A RECESSED CHANNEL TRANSISTOR

(75) Inventors: Jun-Hee Lim, Seoul (KR); Hyuck-Chai Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 552 days.

(21) Appl. No.: 12/591,142

(22) Filed: Nov. 10, 2009

(65) Prior Publication Data

US 2010/0127325 A1    May 27, 2010

(30) Foreign Application Priority Data

Nov. 21, 2008  (KR) .................. 10-2008-0116120

(51) Int. Cl.
*H01L 29/66*    (2006.01)
*H01L 27/108*    (2006.01)
*H01L 21/265*    (2006.01)
*H01L 49/02*    (2006.01)

(52) U.S. Cl.
CPC ........... *H01L 29/66621* (2013.01); *H01L 28/90* (2013.01); *H01L 27/10823* (2013.01); *H01L 21/26586* (2013.01); *H01L 27/10876* (2013.01)
USPC ...................... 257/330; 257/379; 257/E29.13

(58) Field of Classification Search
USPC ..................................... 257/330, E29.13, 379
See application file for complete search history.

(56) References Cited

U.S. PATENT DOCUMENTS

| | | | |
|---|---|---|---|
| 6,002,151 A * | 12/1999 | Liu et al. ................. | 257/316 |
| 2005/0001266 A1* | 1/2005 | Kim ..................... | 257/330 |
| 2006/0273351 A1* | 12/2006 | Ozoe et al. ............. | 257/220 |
| 2006/0274580 A1* | 12/2006 | Forbes ................. | 365/185.18 |
| 2007/0075361 A1 | 4/2007 | Luyken et al. | |
| 2008/0014695 A1* | 1/2008 | Lee et al. ............... | 438/239 |
| 2010/0078713 A1* | 4/2010 | Mauder et al. ........... | 257/330 |

FOREIGN PATENT DOCUMENTS

| | | |
|---|---|---|
| JP | 2005-229066 | 8/2005 |
| KR | 10-0598172 | 6/2006 |

* cited by examiner

*Primary Examiner* — Zandra Smith
*Assistant Examiner* — Jamie C Niesz
(74) *Attorney, Agent, or Firm* — Harness, Dickey & Pierce, P.L.C.

(57) ABSTRACT

A recessed channel transistor, a semiconductor device including a transistor and methods of manufacturing the same are provided, the recessed channel transistor includes a gate structure, a second impurity region and a first impurity region. The gate structure may be formed on a substrate and filling a recess. The first impurity region, including first impurities, may be formed at a first upper portion of the substrate adjacent to the gate structure. The second impurity region, including second impurities, may be formed at a second upper portion of the substrate contacting the gate structure. The first impurity region may surround the second impurity region. The first impurities have a conductive type different from that of the second impurities.

12 Claims, 12 Drawing Sheets

RECESSED CHANNEL TRANSISTORS, AND SEMICONDUCTOR DEVICES INCLUDING A RECESSED CHANNEL TRANSISTOR

CROSS-REFERENCE TO RELATED APPLICATION

This application claims priority under 35 USC §119 to Korean Patent Application No. 10-2008-0116120, filed on Nov. 21, 2009 in the Korean Intellectual Property Office (KIPO), the contents of which are herein incorporated by reference in their entirety.

BACKGROUND

1. Field

Example embodiments relate to transistors, semiconductor devices including a transistor and methods of manufacturing the same. Other example embodiments relate to recessed channel transistors, semiconductor devices including a recessed channel transistor and methods of manufacturing the same.

2. Description of the Related Art

As semiconductor devices become more highly integrated, elements of the semiconductor devices become smaller in size. As such, the area of a gate structure of a transistor is reduced. Various methods for increasing a channel length of the transistor having the reduced gate structure have been studied.

Among the methods, a method of manufacturing a recess channel array transistor (RCAT), in which a recessed gate structure is formed, has been developed. The RCAT may have a long channel length. A gate induced drain leakage (GIDL) current of the RCAT having the long channel length may undesirably increase. As such, a dynamic random access memory (DRAM) device including the RCAT may have poor refresh characteristics.

SUMMARY

Example embodiments relate to transistors, semiconductor devices including a transistor and methods of manufacturing the same. Other example embodiments relate to recessed channel transistors, semiconductor devices including a recessed channel transistor and methods of manufacturing the same.

Example embodiments provide recessed channel transistors having a low gate induced drain leakage (GIDL) current and methods of manufacturing a recessed channel transistor having a low GIDL current.

Example embodiments provide semiconductor devices including a recessed channel transistor having a low GIDL current and methods of manufacturing a semiconductor device including a recessed channel transistor having a low GIDL current.

According to example embodiments, there is provided a recessed channel transistor. The recessed channel transistor includes a gate structure, a second impurity region and a first impurity region. The gate structure is formed on a substrate, and fills a recess. The second impurity region is formed at a second upper portion of the substrate contacting the gate structure. The second impurity region includes second impurities. The first impurity region is formed at a first upper portion of the substrate adjacent to the gate structure surrounding the second impurity region, and includes first impurities having a conductive type different from that of the second impurities.

In example embodiments, the first impurities may have an n-type conductivity and the second impurities may have a p-type conductivity.

In example embodiments, the gate structure may cover a top (or upper) surface of the substrate adjacent to the recess. The second impurity region may be formed at the top surface of the substrate beneath the gate structure.

In example embodiments, the gate structure may include a gate insulation layer on a bottom and a sidewall of the recess, and a gate electrode on the gate insulation layer.

According to example embodiments, there is provided a method of manufacturing a recessed channel transistor. In the method, a recess may be formed in a substrate. Second impurities are implanted into a second upper portion of the substrate exposed by the recess to form a second impurity region contacting the recess. A gate insulation layer may be formed on a bottom and sidewalls of the recess. A gate electrode may be formed on the gate insulation layer to fill a remaining portion of the recess. First impurities are implanted into a first upper portion of the substrate adjacent to the gate structure to form a first impurity region having a conductive type different from that of the second impurities. The first impurities surround the second impurity region.

In example embodiments, the second impurities may be implanted into the second upper portion of the substrate using a hard mask and a pad oxide layer pattern as an ion implantation mask. The pad oxide layer pattern and the hard mask may be sequentially stacked on the substrate.

In example embodiments, formation of the second impurity region may be determined based on the thickness of the hard mask and the pad oxide layer pattern and an angle with respect to a sidewall of the recess at which the second impurities are implanted.

In example embodiments, the gate insulation layer may be formed on a top (or upper) surface of the substrate adjacent to the recess. The gate electrode may be formed over the top surface of the substrate. The second impurity region may be formed at the top surface of the substrate beneath the gate insulation layer.

According to example embodiments, there is provided a method of manufacturing a recessed channel transistor. In the method, first impurities are implanted into a first upper portion of a substrate to form a first impurity region. A recess may be formed through the first upper portion of the substrate. Second impurities are implanted into a second upper portion of the substrate exposed by the recess to form a second impurity region contacting the recess. A gate insulation layer may be formed on a bottom and a sidewall of the recess. A gate electrode may be formed on the gate insulation layer to fill a remaining portion of the recess.

According to example embodiments, there is provided a method of manufacturing a recessed channel transistor. In the method, a recess is formed in a substrate. Second impurities are implanted into a second upper portion of the substrate exposed by the recess to form a second impurity region contacting the recess. A gate insulation layer may be formed on a bottom and a sidewall of the recess. A gate electrode may be formed on the gate insulation layer to fill a remaining portion of the recess. First impurities are implanted at a first upper portion of the substrate adjacent to the gate structure to form a first impurity region having a conductive type different from that of the second impurities. The first impurity region surrounds the second impurity region. A capacitor may be formed electrically connected to the first impurity region.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

DESCRIPTION OF EXAMPLE EMBODIMENTS

Various example embodiments will be described more fully hereinafter with reference to the accompanying drawings, in which some example embodiments are illustrated. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to transistors, semiconductor devices including a transistor and methods of manufacturing the same. Other example embodiments relate to recessed channel transistors, semiconductor devices including a recessed channel transistor and methods of manufacturing the same.

Figure 1:
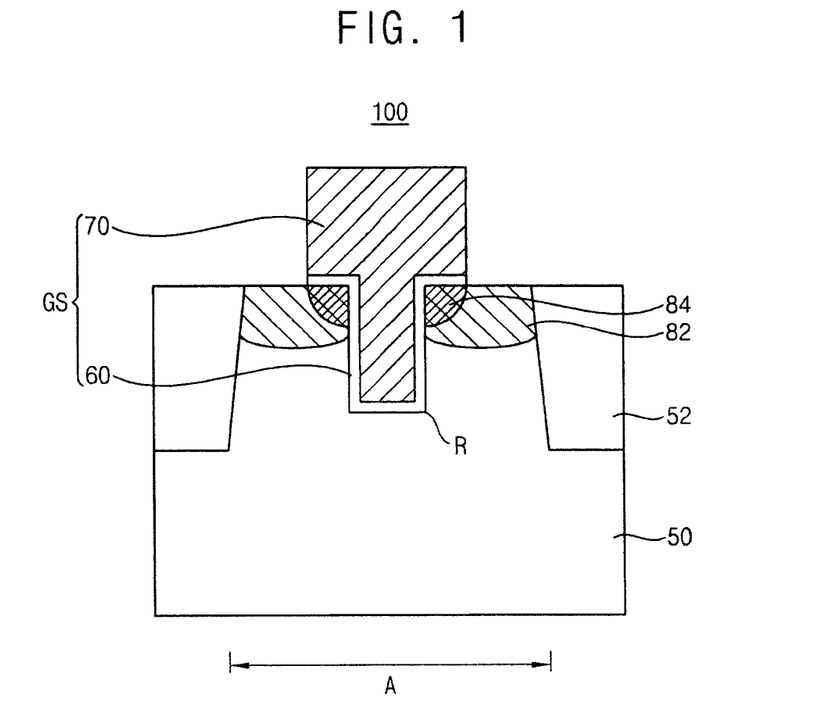
FIG. 1 is a cross-sectional view illustrating a recessed channel transistor in accordance with example embodiments.

FIG. 1 is a cross-sectional view illustrating a recessed channel transistor in accordance with example embodiments.

Referring to FIG. 1, a recessed channel transistor 100 may include a gate structure GS, a first impurity region 82 and a second impurity region 84. The gate structure GS may include a gate electrode 70 and a gate insulation layer 60. The gate structure GS may fill a recess R on a substrate 50. The gate structure GS may include a gate mask (not shown) on a top (or upper) surface of the gate electrode 70. The gate structure GS may include a gate spacer (not shown) on sidewalls of the gate electrode 70 and the gate insulation layer 60. The first and second impurity regions 82 and 84 include first and second impurities, respectively.

The substrate 50 may include a silicon (Si) substrate, a germanium (Ge) substrate, a silicon-germanium (Si—Ge) substrate, a silicon-on-insulator (SOI) substrate, a germanium-on-insulator (GOI) substrate or similar substrate. An isolation layer 52 may be formed on the substrate 50 to define an active region A in the substrate 50. The isolation layer 52 may be formed by an isolation process (e.g., a shallow trench isolation (STI) process). The recess R may have a bar shape having vertical sidewalls and a flat (or horizontal) bottom end. Alternatively, the recess R may have a rounded (or concave) bottom end.

The gate insulation layer 60 may be formed on the substrate 50. Particularly, the gate insulation layer 60 may be formed on a bottom and sidewalls of the recess R. In example embodiments, the gate insulation layer 60 may be formed on a top (or upper) surface of the substrate 50 adjacent to the recess R. The gate insulation layer 60 may have a substantially uniform thickness.

The gate electrode 70 may be formed on the gate insulation layer 60. The gate electrode 70 may fill the remaining portion of the recess R. As shown in FIG. 1, the gate electrode 70 may have an overhang shape in which an upper portion of the gate electrode 70 has a width larger than that of a lower portion thereof that fills the recess R. In other example embodiments, the gate electrode 70 may have a bar shape in which the upper portion of the gate electrode 70 has substantially the same width as that of a lower portion thereof that fills the recess R.

The gate electrode 70 may be a single layer including a metal or a metal silicide. Alternatively, the gate electrode 70 may be a multi-layer having a metal silicide layer and a metal layer. The gate electrode 70 may include tungsten silicide ($WSi_2$), titanium silicide ($TiSi_2$), cobalt silicide ($CoSi_2$), tungsten (W), titanium (Ti), cobalt (Co) or combinations thereof.

The second impurity region 84 may be formed in the active region A of the substrate 50. Particularly, the second impurity region 84 may be formed at a second upper portion of the substrate 50 contacting the gate insulation layer 60 (i.e., the gate structure GS). The second impurities doped in the second impurity region 82 may have a p-type conductivity if the transistor 100 is an n-type metal oxide semiconductor (NMOS) transistor. The second impurities may have an n-type conductivity if the transistor 100 is a p-type metal oxide semiconductor (PMOS) transistor.

The first impurity region 82 may be formed in the active region A of the substrate 50. Particularly, the first impurity region 82 may be formed at a first upper portion of the substrate 50 adjacent to the gate structure. In example embodiments, the first impurity region 82 may surround the second impurity region 84. The first impurity region 82 may function as a source/drain region of the recessed channel transistor 100. The first impurities doped in the first impurity region 82 may have an n-type conductivity if the transistor 100 is an n-type metal oxide semiconductor (NMOS) transistor. The first impurities may have a p-type conductivity if the transistor 100 is a p-type metal oxide semiconductor (PMOS) transistor. That is, the first impurities may have a conductive type different from that of the second impurities.

The second impurity region 84 may increase an electrical distance between the gate electrode 70 and the first impurity region 82 (i.e., the source/drain region of the transistor 100), thereby reducing a gate induced drain leakage (GIDL) current thereof. A current path of the recessed channel transistor 100 may be more distant from the gate insulation layer 60 because of the second impurity region 84, increasing hot carrier immunity.

FIGS. 2 to 6 are cross-sectional views illustrating a method of manufacturing a recessed channel transistor in accordance with example embodiments.

Figure 2:
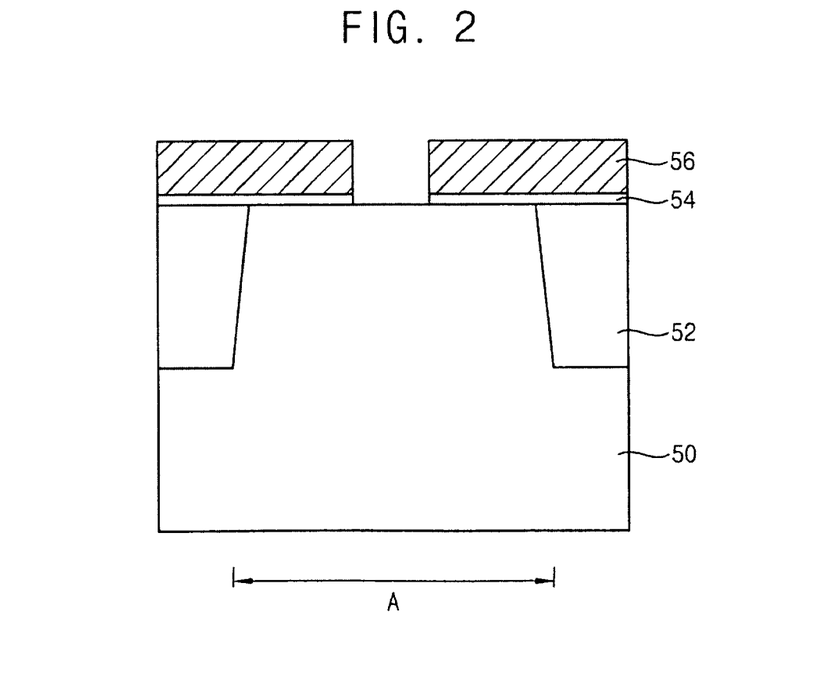
FIGS. 2 to 6 are cross-sectional views illustrating a method of manufacturing a recessed channel transistor in accordance with example embodiments.

Referring to FIG. 2, an isolation layer 52 may be formed on a substrate 50 to define the active region in the substrate 50. The substrate 50 may include a silicon (Si) substrate, a germanium (Ge) substrate, a silicon-germanium (Si—Ge) substrate, a silicon-on-insulator (SOI) substrate, a germanium-on-insulator (GOI) substrate or a similar substrate. The isolation layer 52 may be formed using an oxide (e.g., silicon oxide). The isolation layer 52 may be formed by an isolation process (e.g., an STI process).

A pad oxide layer pattern 54 and a hard mask 56 may be formed on the substrate 50.

The pad oxide layer pattern 54 may be formed using an oxide (e.g., silicon oxide, medium temperature oxide (MTO), etc.). The pad oxide layer pattern 54 may be formed by a chemical vapor deposition (CVD) process, a thermal oxidation process, a plasma enhanced chemical vapor deposition (PECVD) process, an atomic layer deposition (ALD) process, a low pressure chemical vapor deposition (LPCVD) process, a high-density plasma chemical vapor deposition (HDP-CVD) process or a similar deposition process.

The hard mask 56 may be formed using a material having an etching selectivity with respect to the substrate 50 and the pad oxide layer pattern 54. For example, the hard mask 56 may be formed using a nitride (e.g., silicon nitride) or an oxynitride (e.g., a silicon oxynitride). The hard mask may be formed by a CVD process, a PECVD process, an ALD process, an LPCVD process or a sputtering process.

In example embodiments, the pad oxide layer pattern 54 and the hard mask 56 may be formed by a photolithography process. Particularly, after sequentially forming a pad oxide layer and a hard mask layer on the substrate 50, the pad oxide layer and the hard mask layer may be patterned to form the pad oxide layer pattern 54 and the hard mask 56, respectively.

Figure 3:
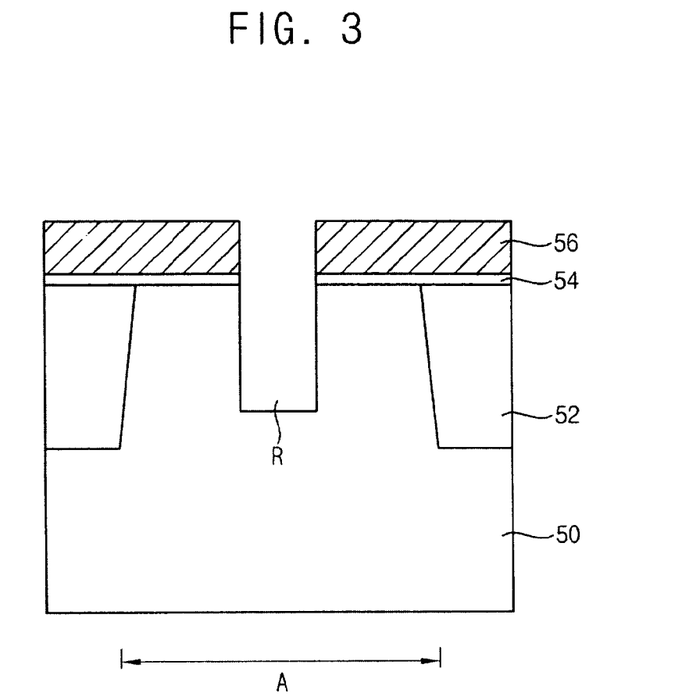

Referring to FIG. 3, an etching process using the hard mask 56 and the pad oxide layer pattern 54 as an etching mask may be performed on the substrate 50 to form a recess R. In example embodiments, the recess R may be formed by an anisotropic etching process so that the recess R may have a vertical sidewall and a flat bottom end.

In example embodiments, the recess R may be formed by sequentially performing an anisotropic etching process and an isotropic etching process on the substrate 50, so that the recess R may have an enlarged lower portion. Particularly, the recess R may have an upper portion having a vertical sidewall and a lower portion having a rounded shape.

A dry etching process or a wet etching process may be performed on the substrate 50 to form the enlarged lower portion of the recess R. If the wet etching process is performed, the gate insulation layer 60 subsequently formed may have increased characteristics.

Figure 4:
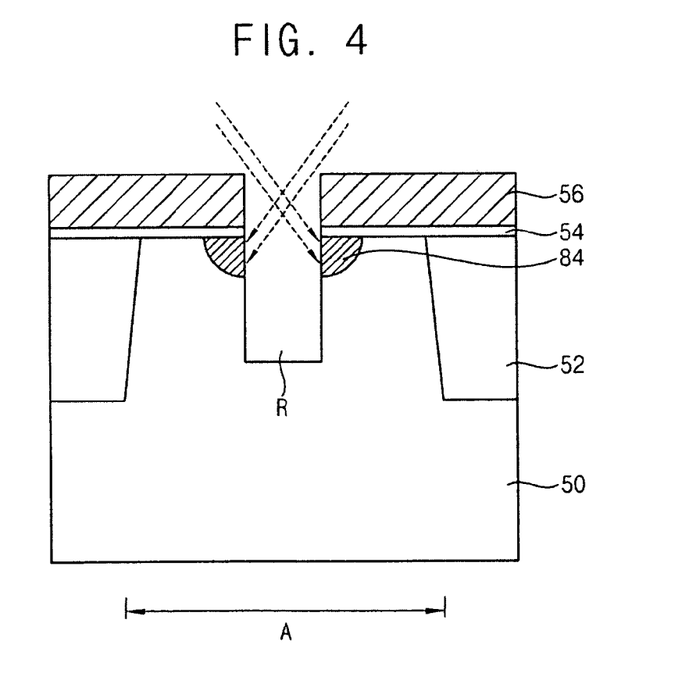

Referring to FIG. 4, an angled ion implantation process using second impurities may be performed on the substrate 50 to form a second impurity region 84. The angled ion implantation process may be performed using the hard mask 56 and the pad oxide layer pattern 54 as an ion implantation mask, so that the second impurities may be implanted into a second upper portion of the substrate 50 exposed by the recess R.

In the angled ion implantation process, the second impurities may be implanted into the substrate 50 at an angle with respect to the sidewall of the recess R. The angle may be varied according to thicknesses of the hard mask 56 and the pad oxidation pattern 54. In example embodiments, the second impurities may be implanted into the substrate 50 at an angle at which the second impurity region 84 may be formed at a portion of the substrate 50 contacting both of the recess R and the pad oxide layer pattern 54.

In example embodiments, the second impurities may have a p-type conductivity.

Figure 5:
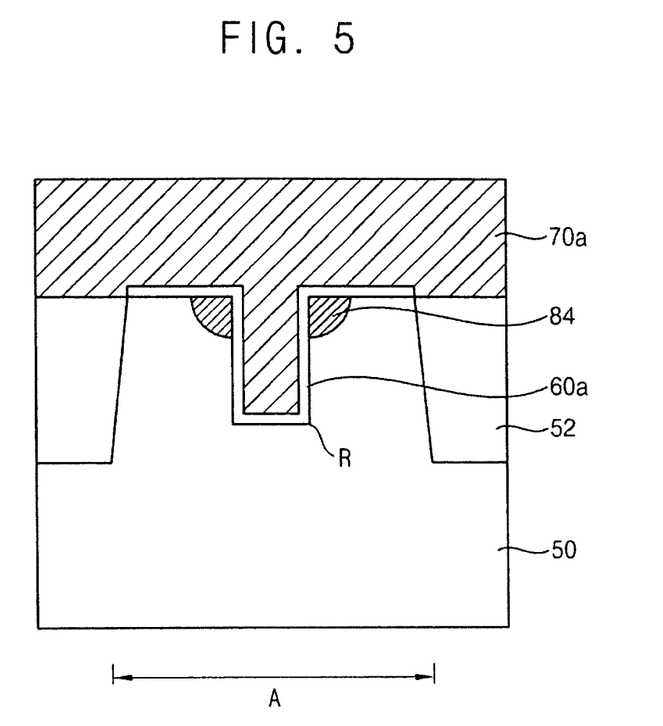

Referring to FIG. 5, after removing the pad oxide layer pattern 54 and the hard mask 56, an insulation layer 60a may be formed on the substrate 50. Particularly, the insulation layer 60a may be formed on the bottom and sidewalls of the recess R and a top (or upper) surface of the substrate 50. The insulation layer 60a may be formed using an oxide or a metal oxide having a substantially high dielectric constant. For example, the insulation layer 60a may be formed using silicon oxide, titanium oxide ($TiO_2$), zirconium oxide ($ZrO_2$), hafnium oxide ($HfO_2$) or a similar oxide. The insulation layer 60a may be formed by a thermal oxidation process, a CVD process, an ALD process or a similar process. In example embodiments, the insulation layer 60a may be formed to have a thickness of about 30 Å to about 80 Å.

A gate conductive layer 70a may be formed on the insulation layer 60a and the isolation layer 52 to fill the remaining portion of the recess R. The gate conductive layer 70a may be formed using a conductive material (e.g., polysilicon doped with impurities, a metal or a conductive metal nitride). The gate conductive layer 70a may be formed by an LPCVD process, a CVD process, a sputtering process, a PECVD process, a pulse laser deposition (PLD) process, an ALD process or a similar process.

In example embodiments, the gate conductive layer 70a may be formed to have a single layer including polysilicon doped with impurities. Particularly, a polysilicon layer may be formed on the insulation layer 60a, and impurities may be doped into the polysilicon layer 60a by an ion implantation process or an in-situ doping process to form the single layer. In other example embodiments, the gate conductive layer 70a may be formed to have a multi-layer including a polysilicon layer and a metal layer.

Figure 6:
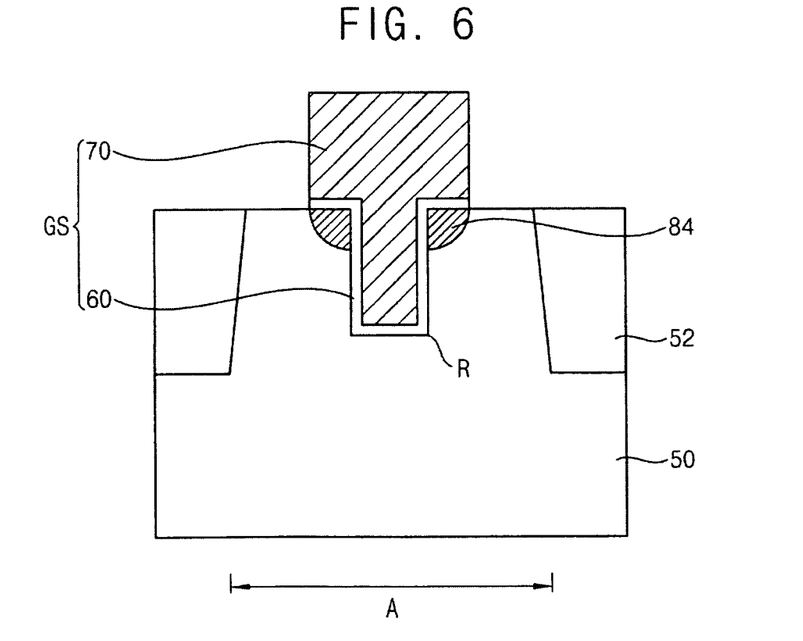

Referring to FIG. 6, after forming a gate mask (not shown) on the gate conductive layer 70a, the gate conductive layer 70a and the insulation layer 60a may be patterned using the gate mask to form a gate structure GS having a gate insulation layer 60 and a gate electrode 70 sequentially stacked on the substrate 50. The gate structure GS may fill the recess R on the substrate 50. A photoresist pattern or a hard mask pattern may function as the gate mask.

The gate mask may be removed after patterning the gate conductive layer 70a and the insulation layer 60a. Alternatively, the gate mask may not be removed, and may function as an element of the gate structure GS.

A gate spacer (not shown) may be formed on a sidewall of the gate structure GS by forming a conductive layer (not shown) covering the gate structure GS on the substrate 50 and performing an anisotropic etching process on the conductive layer.

As shown in FIG. 1, first impurities may be implanted into the substrate 50 using the gate structure GS as an ion implantation mask to form a first impurity region 82 functioning as a source/drain region of the transistor 100 at a first upper portion of the substrate 50. If the gate structure has a bar shape, the first impurities may be also implanted into the second impurity region 84. The second impurity region 84 may keep the original conductivity by controlling the dose of the first impurities. If the gate structure has an overhang shape, the first impurities may not implanted directly into a portion of the substrate 50 under the gate structure GS. The first impurities may be doped into a portion of the substrate 50 under the gate structure GS by diffusion (e.g., by an additional thermal diffusion process). The first impurities may have a conductive type different from that of the second impurities. In example embodiments, the first impurities may have an n-type conductivity.

The recessed channel transistor in accordance with example embodiments may be manufactured by the above described method. The second impurity region 84 may increase an electrical distance between the gate electrode 70 and the first impurity region 82 (i.e., the source/drain region), reducing a GIDL current of the recessed channel transistor 100. A current path of the recessed channel transistor 100 may be more distant (or farther) from the gate insulation layer 60 because of the second impurity region 84, increasing hot carrier immunity.

FIGS. 7 to 11 are cross-sectional views illustrating a method of manufacturing a recessed channel transistor in accordance with example embodiments.

Figure 7:
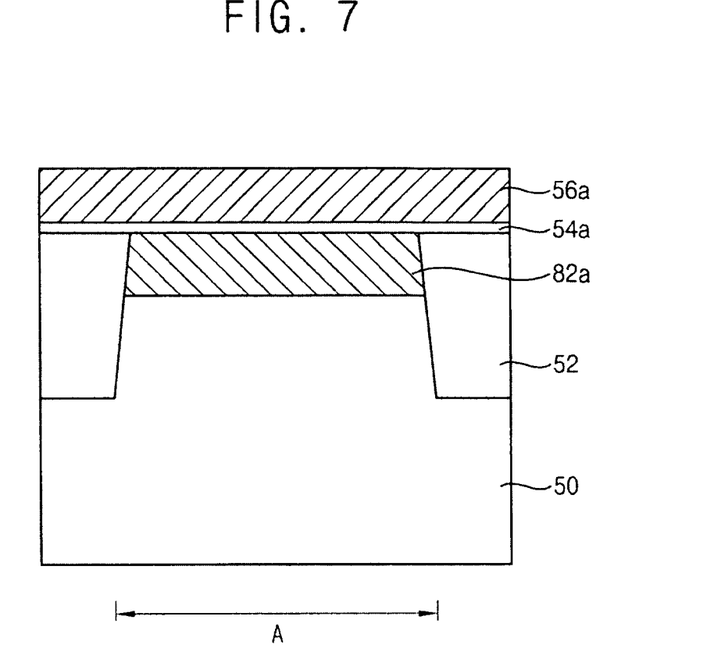
FIGS. 7 to 11 are cross-sectional views illustrating a method of manufacturing a recessed channel transistor in accordance with example embodiments.

Referring to FIG. 7, an isolation layer 52 may be formed on a substrate 50 to define an active region A in the substrate 50. A pad oxide layer 54a may be formed on the substrate 50. The pad oxide layer 54a may prevent (or reduce the likelihood of) a top (or upper) surface of the substrate 50 from being damaged if an ion implantation process for forming an impurity region 82a is subsequently performed. The pad oxide layer 54a may be formed using an oxide (e.g., a silicon oxide). For example, the pad oxide layer 54a may be formed using a MTO. The pad oxide layer 54a may be formed by a CVD process, a thermal oxidation process, a PECVD process, an ALD process, an LPCVD process or an HDP-CVD process or a similar process.

An impurity region 82a may be formed at a first upper portion of the active region in the substrate 50. The impurity region 82a may be formed by implanting first impurities into the substrate 50. The first impurities may have an n-type conductivity if the recessed channel transistor is an NMOS transistor. The first impurities may have a p-type conductivity if the recessed channel transistor is a PMOS transistor.

A mask layer 56a may be formed on the pad oxide layer 54a. The mask layer 56a may be formed using a nitride (e.g., silicon nitride) or an oxynitride (e.g., silicon oxynitride). The mask layer 56a may be formed by a CVD process, a PECVD process, an ALD process, an LPCVD process or a sputtering process.

Figure 8:
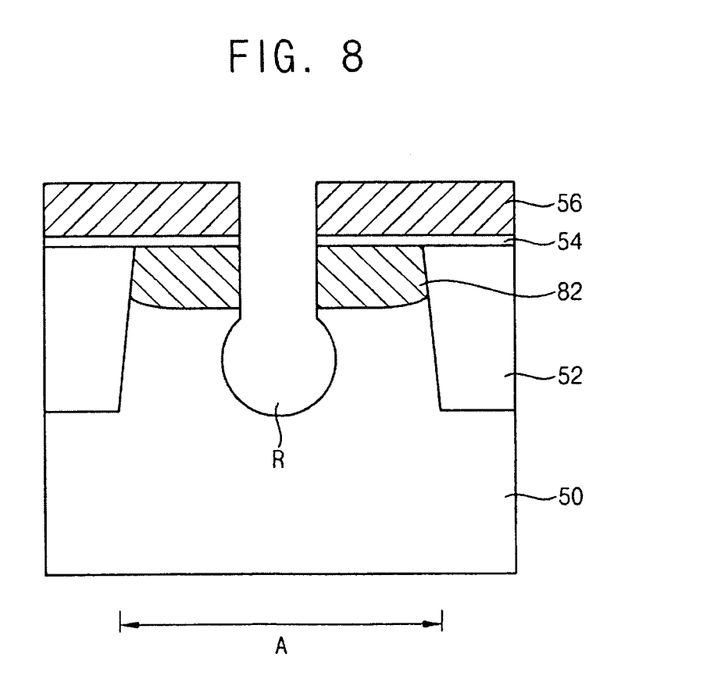

Referring to FIG. 8, the mask layer 56a, the pad oxide layer 54a and the impurity region 82a may be patterned to form an opening through the mask layer 56a and the pad oxide layer 54a and at a portion of the substrate 50. A lower portion of the opening, at the portion of the substrate 50, may be a recess R. A hard mask 56, a pad oxide layer pattern 54 and a first impurity region 82 may be formed as a result of the patterning.

The recess R may be formed by an etching process using the hard mask 56 and the pad oxide layer pattern 54 as an etching mask. In example embodiments, the recess R may be formed by sequentially performing an anisotropic etching process and an isotropic etching process, so that the recess R may have an enlarged lower portion. Particularly, in the anisotropic etching process, an upper portion of the recess R may be formed to have a vertical sidewall, and in the subsequent isotropic etching process, a lower portion of the recess R may be formed to have a rounded shape. A dry etching process or a wet etching process may be performed on the substrate 50 to form the enlarged lower portion of the recess R. If the wet etching process is performed, the gate insulation layer 60 subsequently formed may have increased characteristics.

Figure 9:
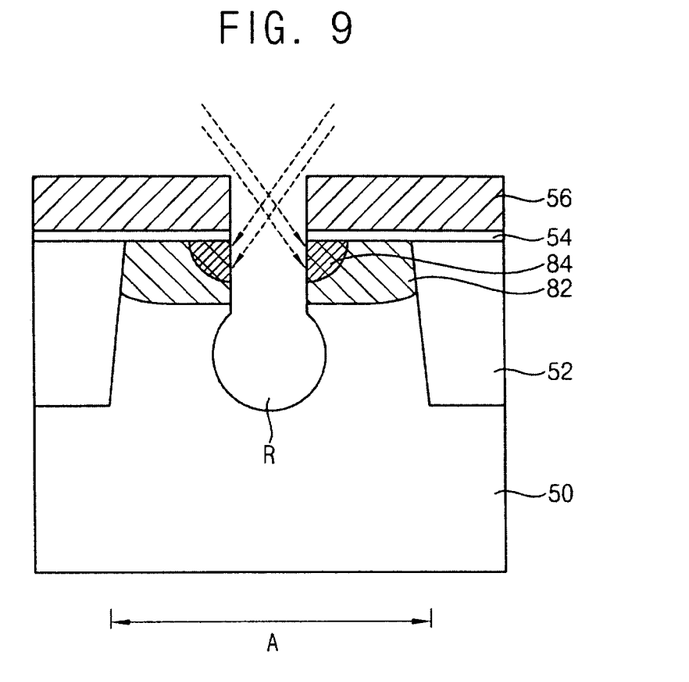

Referring to FIG. 9, an angled ion implantation process using second impurities may be performed on the substrate 50 to form a second impurity region 84. The angled ion implantation process may be performed using the hard mask 56 and the pad oxide layer pattern 54 as an ion implantation mask, so that the second impurities may be implanted into a second upper portion of the substrate 50 exposed by the recess R.

In the angled ion implantation process, the second impurities may be implanted into the substrate 50 at an angle with respect to the sidewall of the recess R. The angle may be varied according to thicknesses of the hard mask 56 and the pad oxidation pattern 54. In example embodiments, the second impurities may be implanted into the substrate 50 at an angle at which the second impurity region 84 may be formed at an upper portion of the substrate 50 contacting both of the recess R and the pad oxide layer pattern 54.

The second impurities may have a conductive type different from that of the first impurities. Particularly, if the first impurities have an n-type conductivity, the second impurities may have a p-type conductivity.

The second impurities may be also implanted into the first impurity region 82. The second impurity region 84 may have a conductive type different by controlling the dose of the second impurities. The portion of the substrate 50, at which some of the first impurities were previously implanted, may be changed into the second impurity region 84.

The second impurity region 84 may increase an electrical distance between the gate electrode 70 and the first impurity region 82 (i.e., the source/drain region), reducing a GIDL current of the recessed channel transistor 100.

Figure 10:
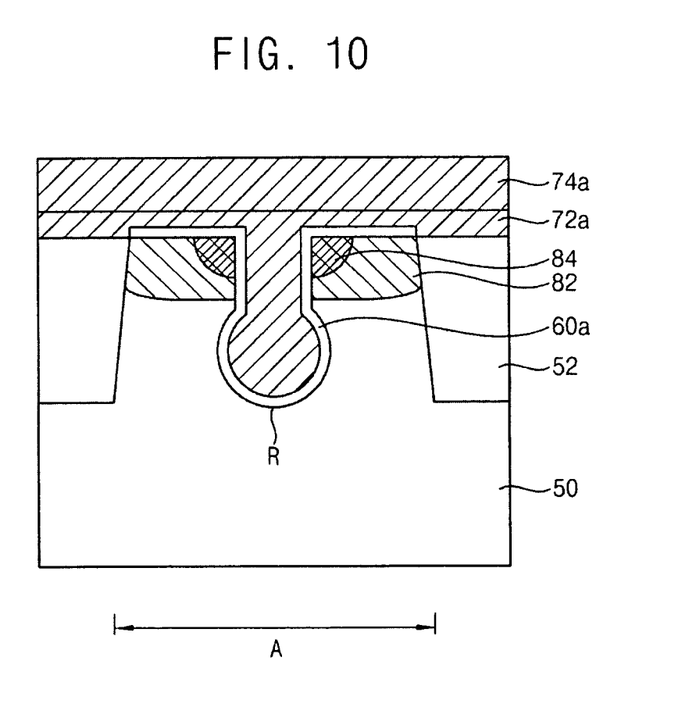

Referring to FIG. 10, after removing the pad oxidation layer pattern 54 and the hard mask 56, an insulation layer 60a may be formed on the substrate 50. Particularly, the insulation layer 60a may be formed on a bottom and sidewalls of the recess R and a top (or upper) surface of the substrate 50. The insulation layer 60a may be formed using an oxide or a metal oxide having a substantially high dielectric constant.

A gate conductive layer 72a may be formed on the insulation layer 60a and the isolation layer 52 to fill the remaining portion of the recess R. The gate conductive layer 72a may be formed using a conductive material (e.g., polysilicon doped with impurities, a metal or a conductive metal nitride). The gate conductive layer 72a may be formed by an LPCVD process, a CVD process, a sputtering process, a PECVD process, a pulse laser deposition (PLD) process, an ALD process or a similar process. In example embodiments, the gate conductive layer 72a may be formed to have a single layer including polysilicon doped with impurities. Particularly, a polysilicon layer may be formed on the insulation layer 60a, and impurities may be doped into the polysilicon layer 60a by an ion implantation process or an in-situ doping process to form the single layer.

A second conductive layer 74a may be formed on the first conductive layer 72a. In example embodiments, the second conductive layer 74a may be formed to have a single layer including a metal silicide or a metal. In other embodiments, the second conductive layer 74a may be formed to have a multi-layer including a metal silicide layer and a metal layer. For example, the second conductive layer 74a may be formed using tungsten silicide ($WSi_2$), titanium silicide ($TiSi_2$), cobalt silicide ($CoSi_2$), tungsten (W), titanium (Ti), cobalt (Co) or combinations thereof.

Figure 11:
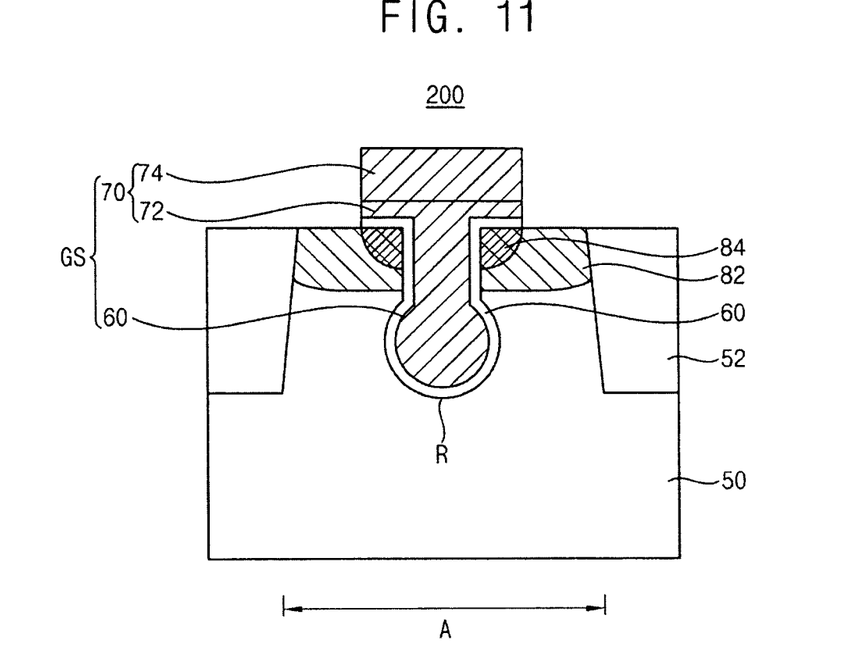

Referring to FIG. 11, after forming a gate mask (not shown) on the second gate conductive layer 74a, the first and second gate conductive layers 72a and 74a and the insulation layer 60a may be patterned using the gate mask to form a gate structure GS having a gate insulation layer 60 and a gate electrode 70 sequentially stacked on the substrate 50. The gate electrode 70 may include a first conductive layer pattern 72 and a second conductive layer pattern 74. The gate structure GS may fill the recess R on the substrate 50.

A photoresist pattern or a hard mask pattern may function as the gate mask. The gate mask may be removed after patterning the first and second gate conductive layers 72a and 74a and the insulation layer 60a, forming a transistor 200.

Alternatively, the gate mask may not be removed, and may function as an element of the gate structure GS. A gate spacer (not shown) may be formed on sidewalls of the gate structure GS by forming a conductive layer (not shown) covering the gate structure GS on the substrate 50 and performing an anisotropic etching process on the conductive layer.

FIGS. 12 to 18 are cross-sectional views illustrating a method of manufacturing a semiconductor device including recessed channel transistors in accordance with example embodiments.

Figure 12:
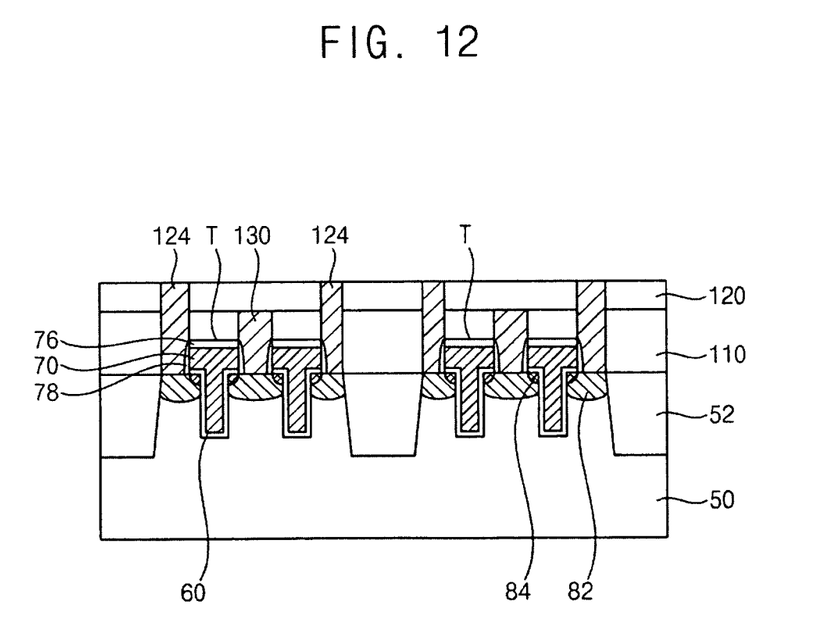
FIGS. 12 to 18 are cross-sectional views illustrating a method of manufacturing a semiconductor device including a recessed channel transistor in accordance with example embodiments.

Referring to FIG. 12, a plurality of recessed channel transistors T (each of which is similar to either the transistor 100 shown in FIG. 1 or the transistor 200 shown in FIG. 11) may be formed on a substrate 50. Each of the recessed channel transistors T in FIG. 12 may include a gate mask 76 on the gate electrode 70, and a gate spacer 78 on sidewalls of the gate mask 76, the gate electrode 70 and the gate insulation layer 60. The transistors T may be similar to either the transistor 100 shown in FIG. 1 or the transistor 200 shown in FIG. 11, thus a detailed explanation of the transistors is omitted here for the sake of brevity.

A first insulating interlayer 110 may be formed on the substrate 50 to cover the recessed channel transistors. The first insulating interlayer 110 may be formed using borophosphosilicate glass (BPSG), phosphosilicate glass (PSG), spin on glass (SOG), plasma enhanced-TEOS (PE-TEOS), undoped silicate glass (USG), HDP-CVD oxide or a similar oxide. A first plug 130 electrically connected to a portion of the first impurity region 82 may be formed through the first insulating interlayer 110. The first plug 130 may be formed using polysilicon doped with impurities or a metal.

A bit line (not shown) may be formed on the first insulating interlayer 110 to be electrically connected to the first plug 130. The bit line may be formed using a metal or a metal nitride.

A second insulating interlayer 120 may be formed on the first insulating interlayer 110 and the first plug 130 to cover the bit line. The second insulating interlayer 120 may be formed using BPSG, PSG, SOG, PE-TEOS, USG, HDP-CVD oxide or a similar oxide. A second plug 124 electrically connected to a portion of the first impurity region 82 may be formed through the first and second insulating interlayers 110 and 120. The second plug 124 may be formed using polysilicon doped with impurities or a metal.

Figure 13:
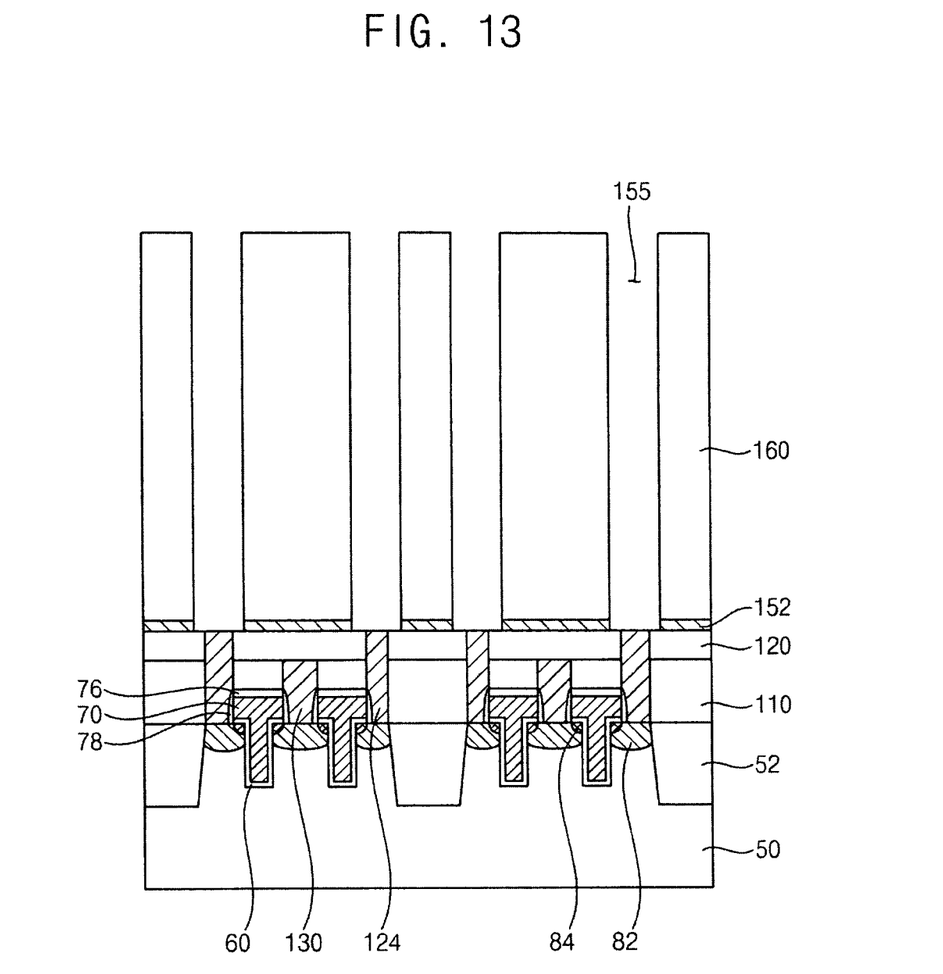

Referring to FIG. 13, an etch stop layer 152 may be formed on the second insulating interlayer 120 and the second plug 124. In example embodiments, the etch stop layer 152 may be formed to prevent (or reduce the likelihood of) the second plug 124 from being damaged, if a mold layer 160 subsequently formed is partially etched. The etch stop layer 152 may be formed to a thickness of about 10 Å to about 200 Å. The etch stop layer 152 may be formed using a nitride or a metal oxide having an etching selectivity with respect to the mold layer 160.

The mold layer 160 may be formed on the etch stop layer 152. The mold layer 160 may be formed using a silicon oxide. For example, the mold layer 160 may be formed using TEOS, HDP-CVD oxide, PSG, USG, BPSG, SOG or a similar oxide. The mold layer 160 may be formed to have a multi-layered structure in which at least two of the above materials are included. If the mold layer 160 has the multi-layered structure in which a plurality of layers including different materials is stacked, a capacitor subsequently formed using the mold layer 160 may have various shapes according to the etch rates of each layers.

The mold layer 160 may be formed to have a proper (or appropriate) thickness according to a desired capacitance of the capacitor, because the capacitance of the capacitor may depend on a height thereof. The height of the capacitor may be controlled by the thickness of the mold layer 160.

An opening 155 may be formed through the mold layer 160 and the etch stop layer 152 to expose the second plug 124.

Figure 14:
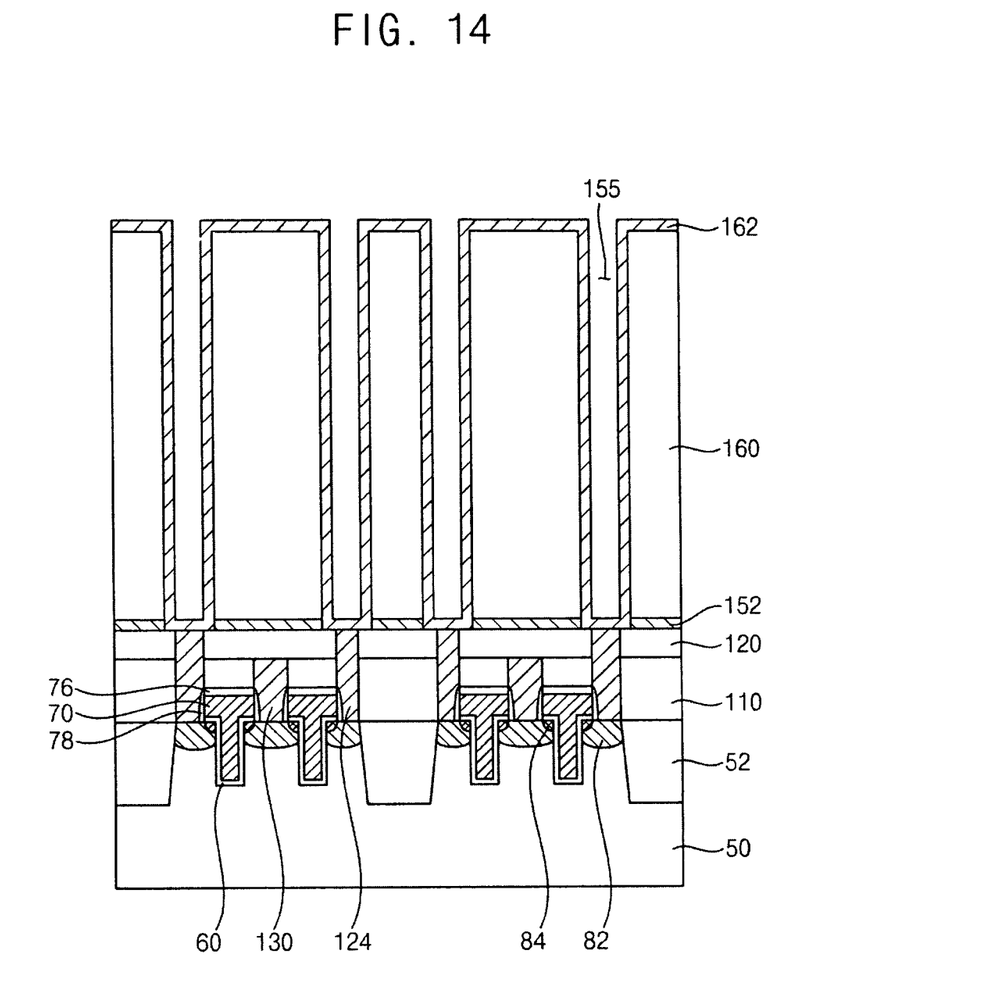

Referring to FIG. 14, a conductive layer 162 may be formed on a bottom and sidewalls of the opening 155 and on the mold layer 160. The conductive layer 162 may be formed using a material different from that of the second plug 124. The conductive layer 162 may be formed using titanium (Ti) or titanium nitride (TiN). The conductive layer 162 may be formed to have a single layer or a multi-layered structure. If the conductive layer 162 is not formed using polysilicon but using a metal or a material nitride, a depletion layer may not be formed at an interface between the conductive layer 162 and a dielectric layer 180 subsequently formed (see FIG. 20), so that the capacitance may be increased.

The conductive layer 162 may be formed by a CVD process, a cyclic CVD process or an ALD process having substantially good step coverage characteristics.

Figure 15:
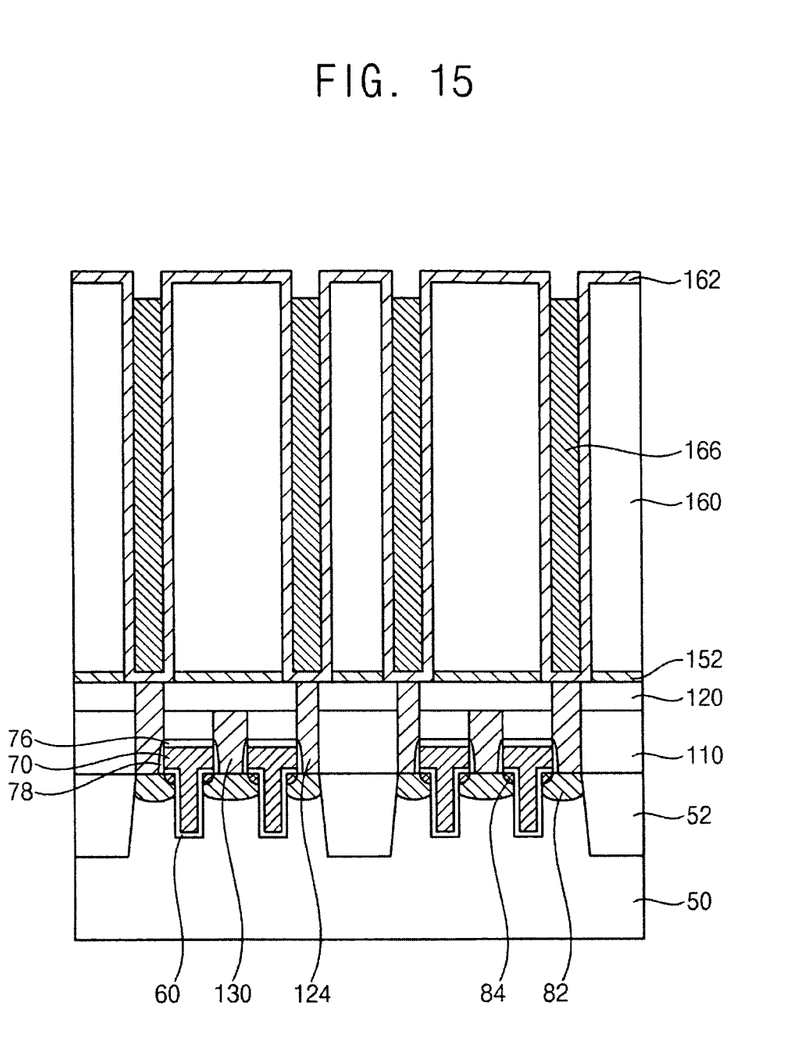

Referring to FIG. 15, a buffer layer pattern 166 may be formed on the conductive layer 162 to fill the remaining portion of the opening 155. Particularly, a buffer layer may be formed on the conductive layer 162 to fill the remaining portion of the opening 155. The buffer layer may be formed using silicon oxide (e.g., SOG). An upper portion of the buffer layer may be etched until the conductive layer 162 is exposed. The etching process may be performed using an etching solution including hydrofluoric acid. The buffer layer pattern 166 may be formed within the opening 155.

Figure 16:
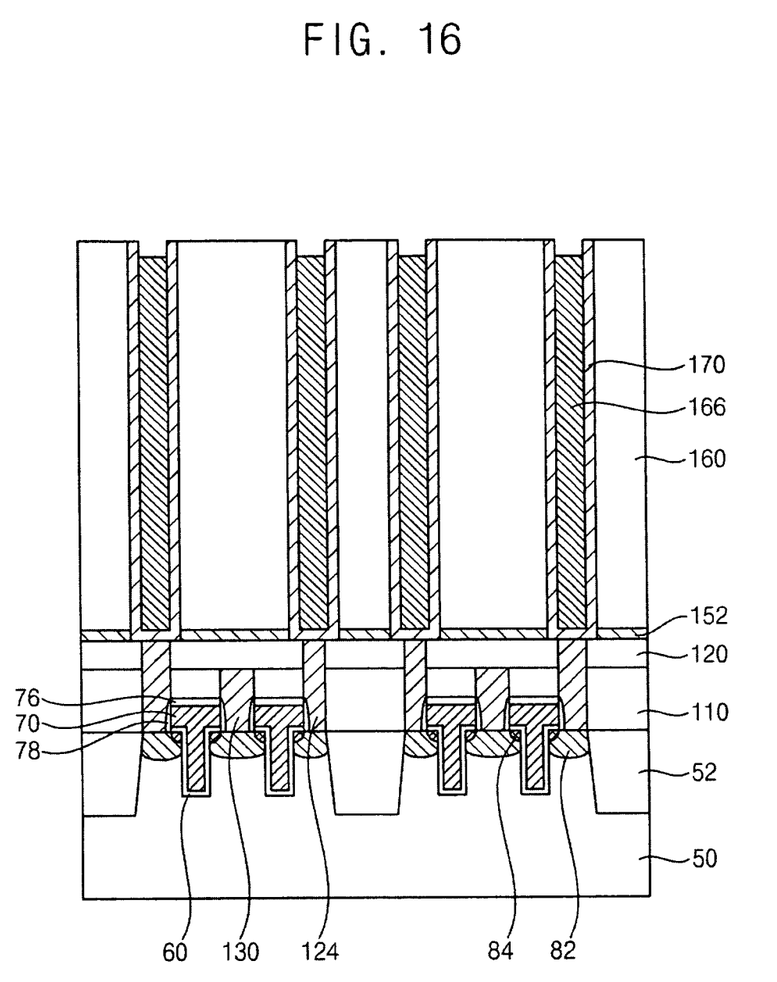

Referring to FIG. 16, a portion of the conductive layer 165 on the mold layer 160 may be removed. Particularly, the conductive layer 165 may be etched using the buffer layer pattern 166 as an etching mask until the mold layer 160 is exposed. As such, the conductive layer 162 may be transformed into a lower electrode 170 having a cylindrical shape.

Figure 17:
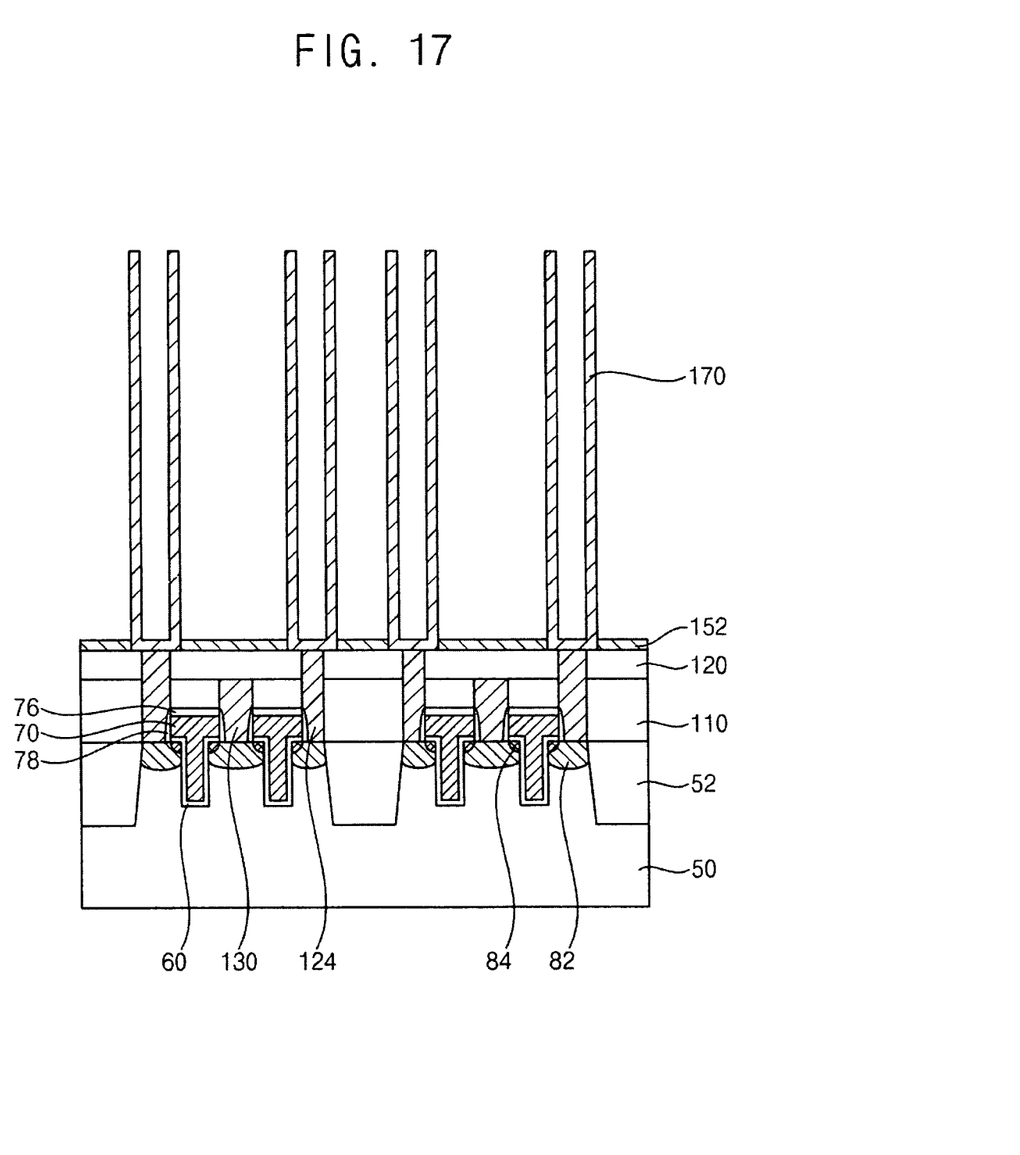

Referring to FIG. 17, a wet etching process may be performed to remove the mold layer 160 and the buffer layer pattern 166. The mold layer 160 and the buffer layer pattern 166 include a silicon oxide. The silicon oxide may be removed by the wet etching process using, for example, a LAL solution including water, hydrofluoric acid and hydrofluoric ammonium. The LAL solution may include a metal corrosion inhibitor and a surface active agent for preventing (or reducing) corrosion of the lower electrode 170 and adhesion of an oxide thereto.

Figure 18:
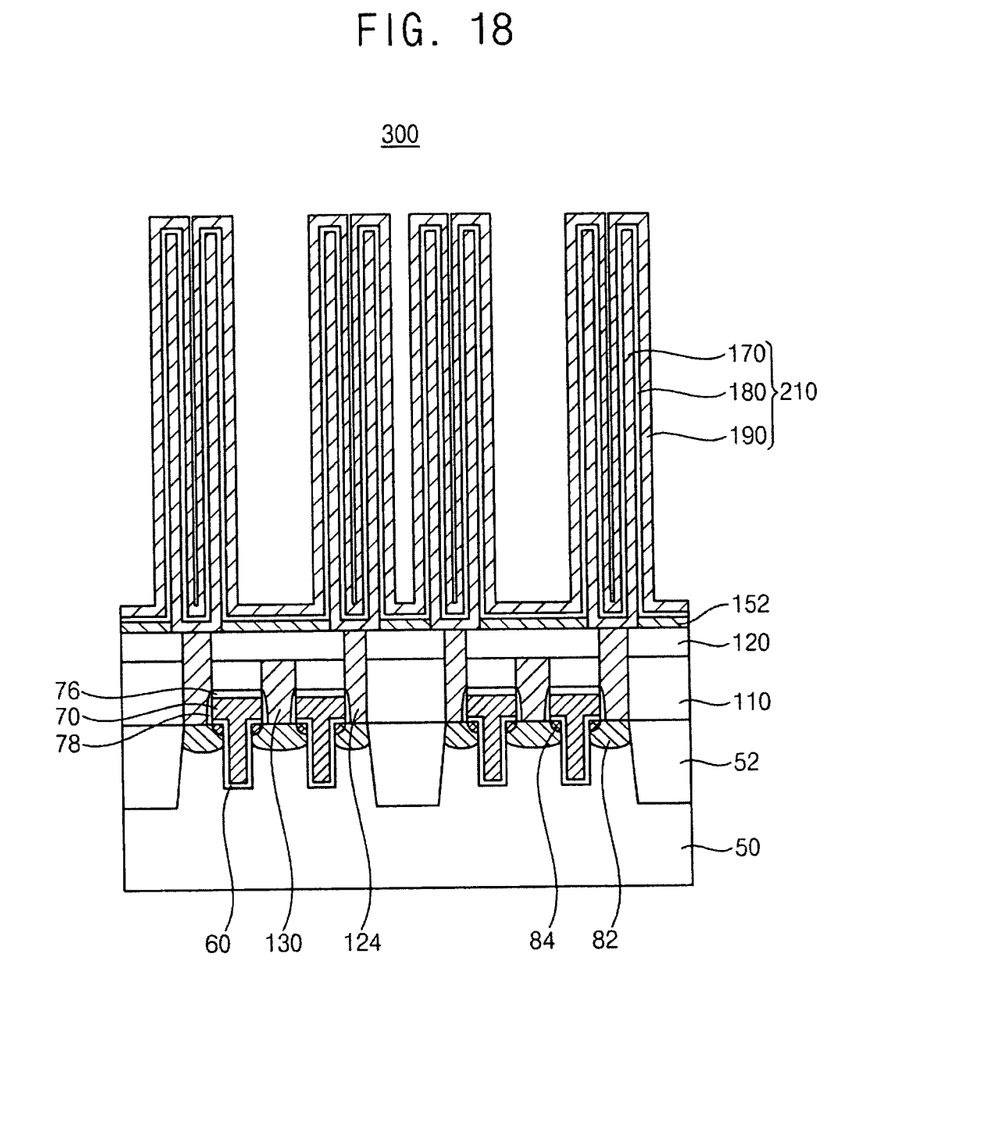

Referring to FIG. 18, the dielectric layer 180 having a substantially uniform thickness may be formed on the lower electrode 170. The dielectric layer 180 may be formed using a metal oxide having a substantially high dielectric constant (e.g., aluminum oxide or hafnium oxide).

An upper electrode 190 may be formed on the dielectric layer 180. The upper electrode 190 may be formed using a metal or a metal nitride. The upper electrode 190 may be formed to have a single layer or a multi-layered structure. The upper electrode 190, the dielectric layer 180 and the lower electrode 170 may collectively form a capacitor 210. As illustrated above, a semiconductor device 300 may be manufactured.

According to example embodiments, a recessed channel transistor may have a second impurity region increasing an electrical distance between a gate electrode and a source/drain region of the transistor. Thus, the transistor may have a reduced GIDL current. A current path of the transistor may be more distant (or farther) from a gate insulation layer because of the second impurity region, increasing hot carrier immunity.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A recessed channel transistor, comprising:
a gate structure on a substrate, the gate structure filling a recess in the substrate;
a first impurity region at a first upper portion of the substrate adjacent to the gate structure, the first impurity region including a plurality of first impurities; and
a second impurity region at a second upper portion of the substrate contacting the gate structure, the second impurity region including a plurality of second impurities having a conductive type different from that of the plurality of first impurities, and the first impurity region surrounding the second impurity region,
wherein the first and second impurity regions are at an upper surface of the substrate,
wherein the second impurity region is in the first impurity region, and a bottom of the first impurity region is lower than a bottom of the second impurity region,
wherein the gate structure includes,
a gate insulation layer directly on a bottom and a sidewall of the recess, and
a gate electrode on the gate insulation layer,
wherein the gate insulation layer and the gate electrode are on an upper surface of the substrate adjacent to the recess such that both ends of the gate electrode and both ends of the gate insulation layer are aligned with a peripheral edge of the second impurity region.

2. The recessed channel transistor of claim 1, wherein the plurality of first impurities has an n-type conductivity and the plurality of second impurities has a p-type conductivity.

3. The recessed channel transistor of claim 1, wherein the gate structure covers the upper surface of the substrate adjacent to the recess, and the second impurity region is formed at the upper surface of the substrate beneath the gate structure.

4. The recessed channel transistor according to claim 1, wherein the second impurity region is between the first impurity region and the gate insulation layer on the upper surface of the substrate.

5. The recessed channel transistor of claim 1, wherein the gate structure covers the upper surface of the substrate adjacent to the recess, and the second impurity region is formed at the upper surface of the substrate beneath an upper portion of the gate electrode.

6. The recessed channel transistor of claim 5, wherein a width of the second impurity region and a width of the gate electrode are equal.

7. The recessed channel transistor of claim 6, wherein the width of the gate electrode is larger than a width of the recess in the substrate.

8. The recessed channel transistor according to claim 1, wherein a bottom portion of the recess in the substrate is round.

9. The recessed channel transistor according to claim 1, wherein a bottom portion of the recess in the substrate is flat.

10. A semiconductor device, comprising:
   the recessed transistor according to claim 1; and
   a capacitor electrically connected to the first impurity region of the recessed transistor.

11. The semiconductor device of claim 10, wherein the plurality of first impurities have an n-type conductivity and the plurality of second impurities have a p-type conductivity.

12. The semiconductor device of claim 10, wherein the gate structure covers the upper surface of the substrate adjacent to the recess, and the second impurity region is formed at the upper surface of the substrate beneath the gate structure.

* * * * *